(12) United States Patent
Tsubokawa et al.

(10) Patent No.: US 10,424,715 B2
(45) Date of Patent: Sep. 24, 2019

(54) ELASTIC WAVE DEVICE AND MANUFACTURING METHOD FOR SAME

(71) Applicant: Murata Manufacturing Co., Ltd., Nagaokakyo-shi, Kyoto-fu (JP)

(72) Inventors: Masashi Tsubokawa, Nagaokakyo (JP); Taku Kikuchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 698 days.

(21) Appl. No.: 15/064,833

(22) Filed: Mar. 9, 2016

(65) Prior Publication Data
US 2016/0190423 A1 Jun. 30, 2016

Related U.S. Application Data

(63) Continuation of application No. PCT/JP2014/074132, filed on Sep. 11, 2014.

(30) Foreign Application Priority Data
Sep. 20, 2013 (JP) ................................. 2013-195513

(51) Int. Cl.
*H01L 41/047* (2006.01)
*H03H 3/08* (2006.01)
(Continued)

(52) U.S. Cl.
CPC ............ *H01L 41/047* (2013.01); *H01L 41/29* (2013.01); *H03H 3/08* (2013.01); *H03H 9/1071* (2013.01);
(Continued)

(58) Field of Classification Search
CPC ........... H03H 9/02535; H03H 9/02637; H03H 9/058; H03H 9/059; H01L 41/047
See application file for complete search history.

(56) References Cited

U.S. PATENT DOCUMENTS 8,004,160 B2\* 8/2011 Tsuda .................... H03H 9/059
310/313 R
9,021,669 B2\* 5/2015 Fukano .................. H03H 9/059
29/25.35
(Continued)

FOREIGN PATENT DOCUMENTS

JP 2686818 B2 12/1997
JP 2002-300000 A 10/2002
(Continued)

OTHER PUBLICATIONS

Official Communication issued in International Application PCT/JP2014/074132, dated Nov. 18, 2014.

*Primary Examiner* — J. San Martin
(74) *Attorney, Agent, or Firm* — Keating & Bennett, LLP

(57) ABSTRACT

In an elastic wave device, IDT electrodes on a piezoelectric substrate are electrically connected to wiring electrodes. A support member covers at least portions of the wiring electrodes. Through-holes in the support member expose upper surfaces of the wiring electrodes and have conductive layers filled therein. The wiring electrodes each have a multilayer structure in which a refractory metal film having a melting point of 900° C. or higher, a diffusion preventive film, and an Al or Al-alloy film are laminated successively from the upper surface side.

13 Claims, 5 Drawing Sheets

(51) Int. Cl.
  *H03H 9/10*   (2006.01)
  *H01L 41/29*  (2013.01)
  *H03H 9/05*   (2006.01)

(52) U.S. Cl.
  CPC ........ *H01L 2224/11* (2013.01); *H03H 9/0514* (2013.01)

(56) References Cited

U.S. PATENT DOCUMENTS

| | | | |
|---|---|---|---|
| 10,148,245 B2* | 12/2018 | Kai | .................... H03H 9/02574 |
| 2002/0024271 A1* | 2/2002 | Hori | .................... H03H 3/08 310/364 |
| 2002/0140322 A1 | 10/2002 | Suga et al. | |
| 2009/0051245 A1 | 2/2009 | Takayama et al. | |
| 2009/0212399 A1 | 8/2009 | Kaneda et al. | |
| 2010/0043189 A1 | 2/2010 | Fukano | |
| 2010/0225202 A1 | 9/2010 | Fukano et al. | |
| 2012/0181898 A1 | 7/2012 | Hatakeyama et al. | |
| 2019/0140614 A1* | 5/2019 | Okada | ................ H03H 9/02921 |

FOREIGN PATENT DOCUMENTS

| | | |
|---|---|---|
| JP | 2003-174056 A | 6/2003 |
| JP | 2007-28195 A | 2/2007 |
| JP | 2007-28196 A | 2/2007 |
| JP | 2008-34816 A | 2/2008 |
| JP | 2009-206183 A | 9/2009 |
| JP | 2010-50726 A | 3/2010 |
| JP | 2010-278971 A | 12/2010 |
| JP | 2011-166488 A | 8/2011 |
| JP | 2012-151698 A | 8/2012 |
| JP | 2012-160840 A | 8/2012 |
| JP | 2013-90273 A | 5/2013 |
| WO | 2006/106831 A1 | 10/2006 |
| WO | 2008/018452 A1 | 2/2008 |
| WO | 2009/057699 A1 | 5/2009 |

* cited by examiner

ELASTIC WAVE DEVICE AND MANUFACTURING METHOD FOR SAME

BACKGROUND OF THE INVENTION

1. Field of the Invention

The present invention relates to an elastic wave device, such as a surface acoustic wave device, and a manufacturing method for the elastic wave device. More particularly, the present invention relates to an elastic wave device that includes wiring electrodes electrically connected to IDT (interdigital transducer) electrodes, and also relates to a manufacturing method for the elastic wave device.

2. Description of the Related Art

From the viewpoint of reducing the size of an electronic device, size reduction of a surface acoustic wave device has also been strongly demanded so far. The surface acoustic wave device is required to include a hollow portion constituted such that IDT electrodes are positioned to face the hollow portion. Under such a situation, Japanese Unexamined Patent Application Publication No. 2010-278971 intends to reduce the size of a surface acoustic wave device including a hollow portion. In Japanese Unexamined Patent Application Publication No. 2010-278971, the IDT electrodes are formed on a piezoelectric substrate. A support layer is disposed on the piezoelectric substrate and surrounds a region where the IDT electrodes are formed. A cover layer serving as a cover member is laminated to cover an opening in the support layer. With that structure, size reduction is realized. A through-hole is formed in the support layer by, e.g., a laser. An under bump metal layer is filled in the through-hole. The under bump metal layer is connected to an underlying electrode.

On the other hand, in a surface acoustic wave device disclosed in Japanese Unexamined Patent Application Publication No. 2003-174056, wiring of two-layer structure is disposed in a partly overlapping relation relative to the IDT electrodes. Japanese Unexamined Patent Application Publication No. 2003-174056 states that cracks generated between the piezoelectric substrate and the IDT electrodes can be suppressed with the above-mentioned feature. In the wiring of two-layer structure, an upper electrode layer is formed of an Al film.

In the surface acoustic wave device disclosed in Japanese Unexamined Patent Application Publication No. 2010-278971, the through-hole is formed in the support layer with irradiation of a laser beam, for example, and the under bump metal layer is formed in the through-hole. In that structure, there is a risk that, when the through-hole is formed, an electrode surface exposed under the through-hole may have its properties altered. In particular, when, as disclosed in Japanese Unexamined Patent Application Publication No. 2003-174056, the two-layer wiring structure including the Al film on the upper surface side is used as a wiring electrode that is connected to the IDT electrodes, there is a risk that the Al film may experience altered properties due to the irradiation of the laser beam. Moreover, the Al film has a natural oxide film on its surface. This causes another problem that when a via conductor, such as the under bump metal layer, is formed by a plating method, a plating film is hard to adhere to the Al film.

SUMMARY OF THE INVENTION

Preferred embodiments of the present invention provide an elastic wave device in which a plating film is able to be reliably formed on each of wiring portions connected to IDT electrodes, and in which even when the plating film is formed by filling a conductive material into a hole, properties of the wiring portion are not altered during a process of forming the hole, and provide a manufacturing method for the elastic wave device.

An acoustic wave device according to a preferred embodiment of the present invention includes a piezoelectric substrate, IDT electrodes disposed on the piezoelectric substrate, wiring electrodes disposed in a state electrically connected to the IDT electrodes and covering portions of the IDT electrodes, an insulating member disposed on the piezoelectric substrate, covering at least portions of the wiring electrodes, and including through-holes to which upper surfaces of the wiring electrodes are exposed, and conductive layers filled in the through-holes of the insulating member.

In a preferred embodiment of the present invention, each of the wiring electrodes has a multilayer structure in which a refractory metal layer having a melting point of 900° C. or higher, a diffusion preventive film, and an Al or Al-alloy film are laminated successively from the upper surface side.

Preferably, the refractory metal layer is made of Pt. In this case, corrosion of the upper surfaces of the wiring electrodes is prevented more reliably.

In an elastic wave device according to a particular aspect of various preferred embodiments of the present invention, the through-holes are holes penetrating through the insulating member and formed by irradiation of a laser beam. Even when the through-holes are formed by the irradiation of the laser beam as in this case, the refractory metal film exposed to each of the through-holes is hard to corrode.

In an elastic wave device according to a preferred embodiment of the present invention, preferably, the diffusion preventive film includes a metal layer that is made of a metal selected from a group consisting of Cu, Au, Ti, Ta, Ni, Cr, W, Ag, Pd, Co and Mn, an oxide or a nitride of one of those metals, or an alloy mainly containing one of those metals. In this case, diffusion of the metal of the refractory metal film, Al contained in the Al or Al-alloy film, etc. is prevented effectively.

In an elastic wave device according to another particular aspect of various preferred embodiments of the present invention, the elastic wave device further includes metal bumps disposed on the conductive layers. In this case, the elastic wave device is able to be surface-mounted at the metal bump side thereof to a mount portion.

In an elastic wave device according to still another particular aspect of various preferred embodiments of the present invention, the elastic wave device further includes a cover member fixed to an upper surface of the insulating member, and the conductive layers are disposed in a state penetrating through the cover member from the insulating member. In this case, a hollow portion is defined by the piezoelectric substrate, the insulating member, and the cover member such that the IDT electrodes are positioned to face the hollow portion. Furthermore, since the metal bumps electrically connected to the IDT electrodes are positioned outside the cover member, the elastic wave device is able to be easily surface-mounted at the cover member side thereof to a mount substrate.

A manufacturing method for an elastic wave device according to another preferred embodiment of the present invention includes the following steps: a step of preparing a piezoelectric substrate including IDT electrodes formed on an upper surface of the piezoelectric substrate; a step of forming wiring electrodes in a state electrically connected to the IDT electrodes and covering portions of the IDT electrodes; a step of forming an insulating member to cover portions of the wiring electrodes; a step of forming through-holes in the insulating member such that upper surfaces of the wiring electrodes are exposed to the through-holes; and a step of filling conductive layers into the through-holes.

In a manufacturing method according to a preferred embodiment of the present invention, in the step of forming the wiring electrodes, an Al or Al-alloy film, a diffusion preventive film, and a refractory metal film made of a refractory metal having a melting point of 900° C. or higher are laminated successively in the mentioned order.

In a manufacturing method for an elastic wave device according to a particular aspect of various preferred embodiments of the present invention, a Pt film is formed as the refractory metal film. In this case, the wiring electrodes are more reliably prevented from having their properties altered.

In a manufacturing method for an elastic wave device according to another particular aspect of various preferred embodiments of the present invention, the through-holes are formed by irradiating the insulating member with a laser beam. The properties of upper surfaces of the wiring electrodes, which are exposed to the through-holes, are not altered even with the irradiation of the laser beam.

In a manufacturing method for an elastic wave device according to another particular aspect of various preferred embodiments of the present invention, a manufacturing method further includes a step of forming metal bumps on the conductive layers. In this case, it is possible to provide the elastic wave device that is able to be surface-mounted to a mount portion with the aid of the metal bumps.

In a manufacturing method for an elastic wave device according to still another particular aspect of various preferred embodiments of the present invention, a manufacturing method further includes a step of fixing a cover member onto the insulating member, the cover member including second through-holes that are communicated with the through-holes of the insulating member, respectively, and the conductive layers are filled into the through-holes of the insulating member and the second through-holes of the cover member. In this case, a hollow portion is defined by the piezoelectric substrate, the insulating member, and the cover member such that the IDT electrodes are positioned to face the hollow portion. Furthermore, the elastic wave device including the hollow portion is able to be easily surface-mounted at the cover member side thereof with the aid of the metal bumps.

With the elastic wave device and the manufacturing method for an elastic wave device according to a preferred embodiment of the present invention, the wiring electrode has the multilayer structure in which the refractory metal layer having a melting point of 900° C. or higher, the diffusion preventive film, and the Al or Al-alloy film are laminated successively from the upper surface side, and the properties of the refractory metal layer are hard to alter even when subjected to the irradiation of the laser beam. Accordingly, the wiring electrode is reliably prevented from having its properties altered. In addition, since the upper surface side of the wiring electrode is hard to be oxidized, a failure in adhesion between the conductive layer and the wiring electrode hardly occurs when the conductive layer is filled into the through-hole to which the wiring electrode is exposed. As a result, the elastic wave device having good reliability in electrical connection is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by explaining preferred embodiments of the present invention with reference to the drawings.

Figure 1A:
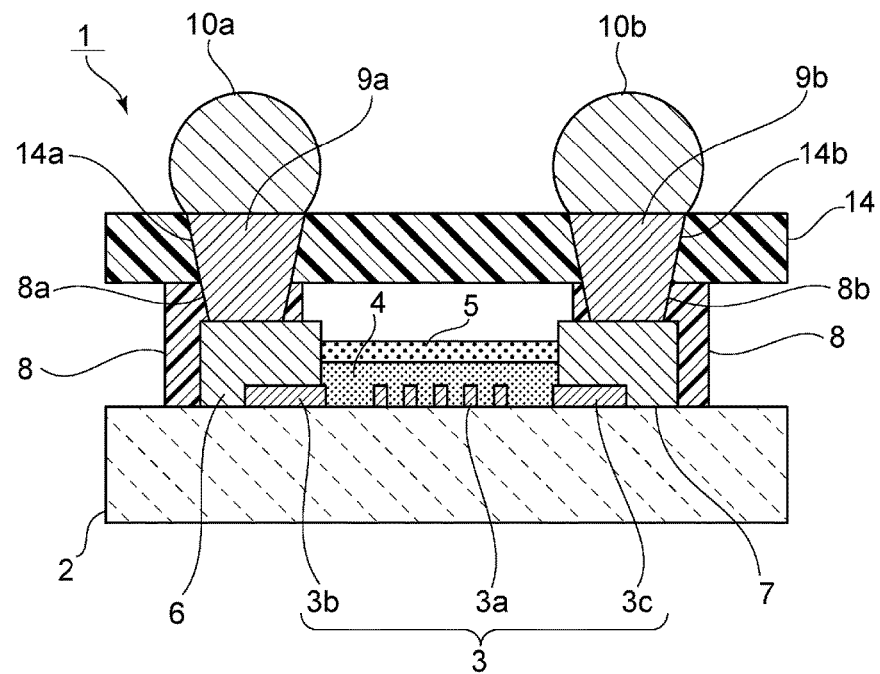
FIGS. 1A and 1B are respectively a front sectional view of an elastic wave device according to a first preferred embodiment of the present invention, and a partial enlarged sectional view illustrating a multilayer structure of a wiring electrode included in the first preferred embodiment.

FIG. 1A is a front sectional view of an elastic wave device according to a first preferred embodiment of the present invention.

An elastic wave device 1 includes a piezoelectric substrate 2. In this preferred embodiment, the piezoelectric substrate 2 preferably is a $LiNbO_3$ substrate. The $LiNbO_3$ substrate may be doped with another element. In various preferred embodiments of the present invention, other piezoelectric substrates made of other types of piezoelectric single crystals, such as a $LiTaO_3$ substrate, may be optionally used instead of the $LiNbO_3$ substrate. Moreover, a piezoelectric ceramic may be used instead of the piezoelectric single crystal.

IDT electrodes 3 are provided on the piezoelectric substrate 2. The IDT electrodes 3 excite surface acoustic waves. The IDT electrodes 3 can be formed preferably by an appropriate thin-film forming method, e.g., vapor deposition or sputtering. The IDT electrodes 3 can be made of an appropriate metal. Examples of the appropriate metal include Al, Pt, Cu, Au, Ti, Ni, Cr, W, Ag, Pd, Co and Mn. Alternatively, alloys of the above-mentioned metals may be optionally used. The IDT electrodes 3 may each include a multilayer metal film that is formed by laminating a plurality of metal films. In this preferred embodiment, the IDT electrodes 3 each preferably include a multilayer metal film that is formed by laminating an Al film on a Pt film.

A dielectric film 4 is provided on the piezoelectric substrate 2 and covers the IDT electrodes 3. In this preferred embodiment, the dielectric film 4 is made of silicon oxide. With that feature, frequency temperature characteristics are improved. Materials usable as the dielectric film 4 are not limited to silicon oxide. Other general dielectric materials, such as silicon nitride, silicon oxynitride, silicon carbide, tantalum oxide, titanium oxide, titanium nitride, aluminum oxide, and tellurium oxide, can also be used.

A second dielectric film 5 is laminated on the dielectric film 4. In this preferred embodiment, the second dielectric film 5 is made of silicon nitride. The second dielectric film 5 may be made of another appropriate one of the above-mentioned dielectric materials.

In this preferred embodiment, the second dielectric film 5 is disposed as a frequency adjustment film and as a moisture-resistant protective film. Thus, frequency adjustment is achieved by adjusting a film thickness of the second dielectric film 5. Furthermore, with the presence of the second dielectric film 5, a portion where the IDT electrodes 3 and the dielectric film 4 are located is protected against moisture.

In order to increase an adjustable frequency extent, the second dielectric film 5 is preferably made of a dielectric material having a higher acoustic velocity than the dielectric film 4. In order to increase the protection ability against moisture, the second dielectric film 5 is preferably made of a dielectric material having a lower water-vapor permeability than the dielectric film 4. For that reason, silicon nitride having a higher acoustic velocity and a lower water-vapor permeability than silicon oxide is preferably used in this preferred embodiment.

The IDT electrodes 3 include a plurality of electrode fingers 3a and terminal electrodes 3b and 3c. The electrode fingers 3a are each electrically connected to the terminal electrode 3b or the terminal electrode 3c. Wiring electrodes 6 and 7 are disposed to cover portions of the terminal electrodes 3b and 3c of the IDT electrodes 3. The wiring electrodes 6 and 7 are electrically connected to the terminal electrodes 3b and 3c, respectively. It is only necessary that the wiring electrodes 6 and 7 are disposed to cover portions of the IDT electrodes 3 outside a region where the plurality of electrode fingers 3a are disposed.

Figure 1B:
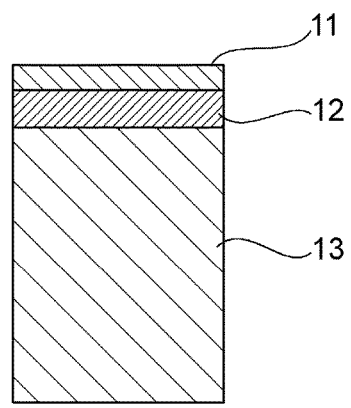

FIG. 1B is a partial enlarged sectional view illustrating a detailed structure of the wiring electrode 6. Looking at details, the wiring electrode 6 has a structure in which a refractory metal film 11, a diffusion preventive film 12, and an Al alloy film 13 are successively laminated in the mentioned order from the top. The refractory metal film 11 serving as a refractory metal layer preferably is a metal film having a melting point of 900° C. or higher, for example. An upper limit of a melting point is not limited to a particular value. The highest temperature among a melting points of known metals is an upper limit. Insofar as the metal having a melting point of 900° C. or higher is used, the refractory metal is not limited to any particular one. The refractory metal may be Pt, Au, Ag, Pd, or an alloy that mainly contains one of those elements and that preferably has a melting point of 900° C. or higher, for example. Pt has a melting point of 1768° C., Au has a melting point of 1064° C., Ag has a melting point of 962° C., and Pd has a melting point of 1554° C. Preferably, Pt or an alloy mainly containing Pt and having a melting point of 900° C. or higher is used. More preferably, a Pt film is used.

A melting point of the refractory metal film 11 preferably is 900° C. or higher. On the other hand, the temperature of a portion where a through-hole is formed reaches about 900° C. to 1000° C. in a step of forming the through-hole with laser irradiation as described later. Therefore, when the refractory metal film 11 has a melting point of 900° C. or higher, the properties of the refractory metal film 11 are difficult to alter during the step of forming the through-hole with the laser irradiation. Preferably, a Pt film is used as described above such that the alteration of properties of the refractory metal film 11 is suppressed or prevented with higher reliability.

In this preferred embodiment, the diffusion preventive film 12 is preferably made of Ti. The diffusion preventive film 12 is disposed to prevent diffusion of Al and another metal component in the Al alloy film 13, and of the refractory metal in the refractory metal film 11. The diffusion preventive film can be made of any appropriate material insofar as the material exhibits the above-described action of preventing the diffusion. Examples of the appropriate material of the diffusion preventive film 12 include Cu, Au, Ti, Ta, Ni, Cr, W, Ag, Pd, Co and Mn other than the metal constituting the refractory metal film 11, and alloys mainly containing those elements. Alternatively, oxides, such as an oxide of Cr, and nitrides, such as a nitride of Cr, may be optionally used. The diffusion preventive film 12 may have a multilayer structure that is formed by laminating a plurality of films made of the above-mentioned materials.

As illustrated in FIG. 1A, a support member 8 defining and functioning as an insulating member is disposed in a state covering the piezoelectric substrate 2. The support member 8 has a frame shape, and the IDT electrodes 3 are disposed in a region surrounded by the frame shape. In this preferred embodiment, the support member 8 is preferably made of a synthetic resin, for example. The material of the support member 8 is not limited to the synthetic resin, and the support member 8 may be made of another insulating material, e.g., an insulating ceramic such as alumina. The support member 8 has a larger thickness than the IDT electrodes 3.

Through-holes 8a and 8b are formed in the support member 8. In this preferred embodiment, the through-holes 8a and 8b are preferably formed by irradiating the support member 8 with a laser beam. With the formation of the through-holes 8a and 8b, upper surfaces of the wiring electrodes 6 and 7 positioned respectively under the through-holes 8a and 8b are exposed. In other words, an upper surface of the refractory metal film 11 is exposed to each of the through-holes 8a and 8b. Since the refractory metal film 11 is made of the refractory metal described above, the properties of the refractory metal film 11 are hard to alter with the irradiation of the laser beam.

A cover member 14 is fixed to an upper surface of the support member 8 to cover a cavity that is surrounded by the support member 8. The cover member 14 can be made of an appropriate synthetic resin. Alternatively, the cover member 14 may be made of an insulating ceramic such as alumina. Through-holes 14a and 14b are formed in the cover member 14 to be continuously aligned with the through-holes 8a and 8b, respectively. In this preferred embodiment, the through-holes 14a and 14b are also formed with irradiation of a laser beam.

An under bump metal layer 9a defining and functioning as a conductive layer is disposed in a state filling a hollow space defined by the through-holes 8a and 14a. An under bump metal layer 9b is disposed in a state filling a hollow space defined by the through-holes 8b and 14b. The under bump metal layers 9a and 9b may be each made of an appropriate metal. Examples of the appropriate metal include Pt, Au, Cu, Ti, Ni, Cr, W, Ag, Pd, Co and Mn. Alternatively, alloys mainly containing the above-mentioned metals may be used. Each of the under bump metal layers 9a and 9b may be made of a single metal, or may have a structure including a plurality of metal films laminated on each other. In this preferred embodiment, the under bump metal layers 9a and 9b are each preferably formed by laminating an Au plating film on a Ni plating film, for example.

The under bump metal layers 9a and 9b are preferably formed by a plating method. With the use of a plating method, the under bump metal layers 9a and 9b are preferably formed through a comparatively simple process. The plating method is not limited to particular one, but an electrolytic plating method is preferably used.

When the under bump metal layers 9a and 9b are formed by the plating method, the plating films are first deposited on upper surfaces of the wiring electrodes 6 and 7, which are exposed respectively to the through-holes 8a and 8b. In this preferred embodiment, the refractory metal film 11 is positioned as the upper surface of each of the wiring electrodes 6 and 7, and the surface properties of the refractory metal film 11 are not altered. Accordingly, the under bump metal layers 9a and 9b are able to be easily and reliably formed by the plating method. As a result, adhesivity and reliability of electrical connection between the under bump metal layer 9a, 9b and the wiring electrode 6, 7 are increased effectively.

Metal bumps 10a and 10b are disposed as metal bumps on the under bump metal layers 9a and 9b, respectively. Thus, since the metal bumps 10a and 10b are positioned outside the cover member 14, the elastic wave device 1 is easily surface-mounted in such a way that a surface of the elastic wave device 1 at the side including the metal bumps 10a and 10b is positioned onto a mount substrate.

In the elastic wave device 1, a planar shape of the piezoelectric substrate 2 preferably is identical to that of the cover member 14, and the piezoelectric substrate 2 and the cover member 14 are entirely overlapped with each other when looking at the elastic wave device 1 in a plan view. Accordingly, a planar shape of the elastic wave device 1 preferably is identical to that of the piezoelectric substrate 2, and size reduction is realized. As an alternative, the planar shape of the cover member 14 may have a smaller size than that of the piezoelectric substrate 2. In any case, the elastic wave device 1 may have a planar shape with a size equal to or smaller than that of the piezoelectric substrate 2, the size being necessary to excite surface acoustic waves.

While, in this preferred embodiment, the under bump metal layers 9a and 9b are provided in the through-holes 8a and 8b, respectively, and the metal bumps 10a and 10b are further disposed, the metal bumps 10a and 10b may be omitted. In such a case, the conductive material filled into each of the through-holes 8a and 8b does not have the function as the under bump metal layer, but it is able to function as another conductive connection member.

In the above elastic wave device 1, since the upper surfaces of the wiring electrodes 6 and 7 preferably are each defined by the refractory metal film 11, properties of the upper surfaces of the wiring electrodes 6 and 7 are difficult to alter even at a temperature applied, for example, in the step of forming the through-holes 8a and 8b. As a result, when conductive materials, such as the under bump metal layers 9a and 9b, are filled into the through-holes of the support member 8 by the plating method, adhesivity and reliability of electrical connection between the wiring electrodes 6, 7 and the conductive materials, such as the under bump metal layer 9a and 9b provided on the wiring electrode 6 and 7, are increased effectively.

A non-limiting example of a manufacturing method for the elastic wave device 1 according to a preferred embodiment of the present invention will be described below with reference to FIGS. 2A to 4D.

Figure 2A:
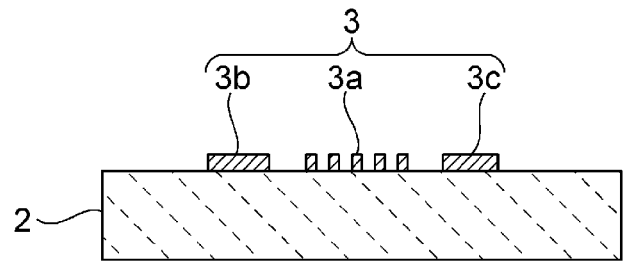
FIGS. 2A to 2D are a series of front sectional views referenced to explain a manufacturing method for an elastic wave device according to a preferred embodiment of the present invention.

First, as illustrated in FIG. 2A, the piezoelectric substrate 2 is prepared. The IDT electrodes 3 are formed on the piezoelectric substrate 2. More specifically, a metal film constituting the IDT electrodes 3 is formed and patterned by photolithography, for example. The IDT electrodes 3 including the plurality of electrode fingers 3a and the terminal electrode 3b and 3c, as described above, are formed in such a manner.

Figure 2B:
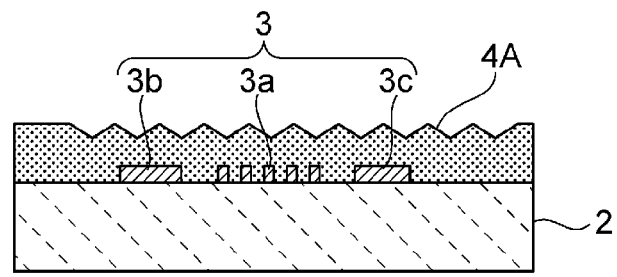

Next, a dielectric film 4A illustrated in FIG. 2B is formed. In this preferred embodiment, the dielectric film 4A made of a silicon oxide film is formed by bias sputtering.

Figure 2C:
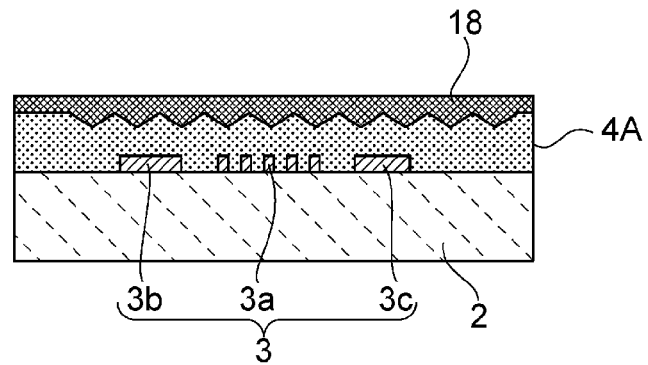

Thereafter, as illustrated in FIG. 2C, a sacrificial layer 18 is formed on the dielectric film 4A. The sacrificial layer 18 is preferably made of a material that has a low viscosity, and that can be coated flat. In this preferred embodiment, the sacrificial layer 18 is made of a photoresist. The material of the sacrificial layer 18 having those properties is not limited to particular one insofar as the material can be etched back. Appropriate photoresists, such as SOG, BARO, and TARC, can be optionally used. In other words, an appropriate material capable of being coated by a general coating method and etched back is usable. The sacrificial layer 18 is formed by coating the above-mentioned material that is suitable to constitute the sacrificial layer 18. Thus, as illustrated in FIG. 2C, the sacrificial layer 18 covers the dielectric film 4A so as to compensate for irregularities in its upper surface. From the viewpoint of eliminating the irregularities, the etching selectivity between the dielectric film 4A and the sacrificial layer 18 is desirably close to 1:1.

Figure 2D:
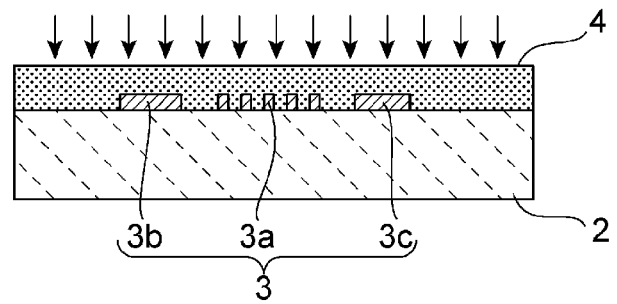

Next, the sacrificial layer 18 and the dielectric film 4A are etched. An etching method in this step may be dry etching or wet etching. In this preferred embodiment, etch-back is performed by the dry etching. More specifically, as illustrated in FIG. 2D, the sacrificial layer 18 is removed, and at least a portion of the dielectric film 4A under the sacrificial layer 18, the portion including the irregularities, is removed. Thus, the dielectric film 4 having a flat upper surface is formed.

Figure 3A:
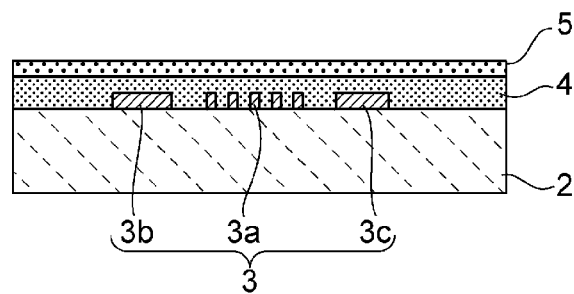
FIGS. 3A to 3D are a series of front sectional views referenced to explain the manufacturing method for the elastic wave device according to a preferred embodiment of the present invention.

Thereafter, as illustrated in FIG. 3A, the second dielectric film 5 is formed. In this preferred embodiment, the second dielectric film 5 made of a silicon nitride film, as described above, is formed by sputtering.

Figure 3B:
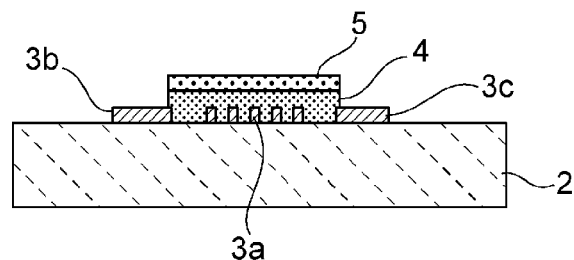

Next, as illustrated in FIG. 3B, portions of the dielectric films 4 and 5, which are positioned respectively above the terminal electrodes 3b and 3c, are partly removed. A method of removing those portions may be a dry process or a wet process. In this preferred embodiment, the dielectric films 4 and 5 are partly removed by the dry process to make respective upper surfaces of the terminal electrodes 3b and 3c exposed.

Figure 3C:
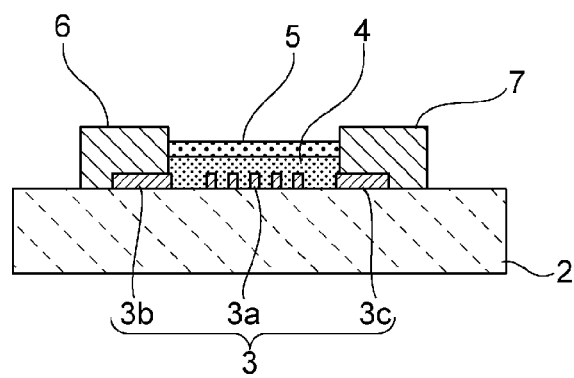

Next, as illustrated in FIG. 3C, the wiring electrodes 6 and 7 are formed. The wiring electrodes 6 and 7 in this preferably embodiment preferably have, as described above, the 3-layer structure of Pt/Ti/AlCu from the top. In other words, the wiring electrodes 6 and 7 are formed by successively forming an AlCu film, a Ti film, and a Pt film in the mentioned order.

Figure 3D:
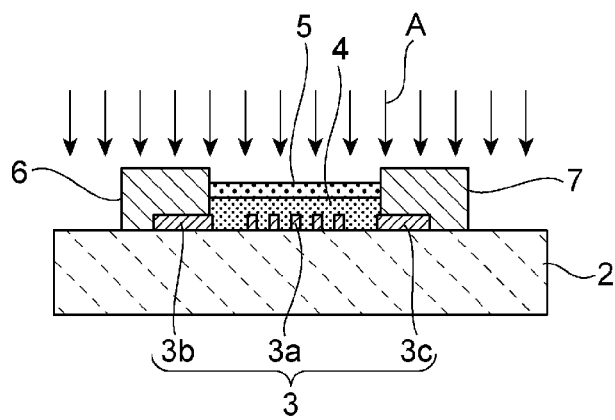

Next, a thickness of the second dielectric film 5 is adjusted by etching in a dry process, as represented by arrows A in FIG. 3D. Frequency adjustment is thus performed.

Figure 4A:
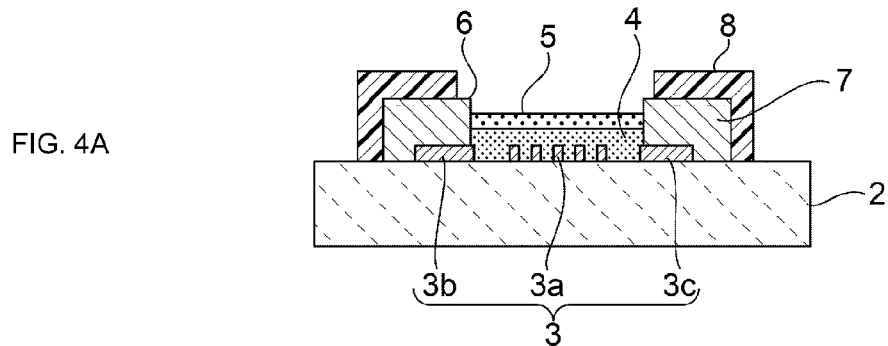
FIGS. 4A to 4D are a series of front sectional views referenced to explain the manufacturing method for the elastic wave device according to a preferred embodiment of the present invention.

Thereafter, as illustrated in FIG. 4A, the support member 8 is formed. The support member 8 is formed by applying a resin material that is suitable to form the support member 8. In this stage, the above-mentioned through-holes 8a and 8b (see FIG. 1A) are not yet formed. The support member 8 can be formed by applying a synthetic rein constituting the support member 8, and by patterning the applied synthetic resin.

Figure 4B:
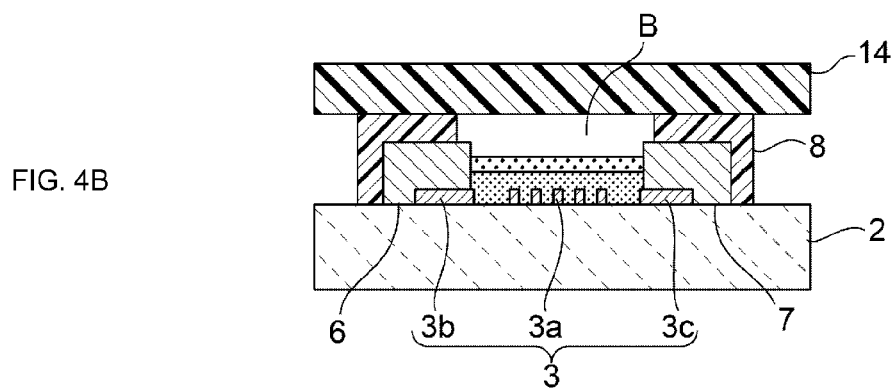

After forming the support member 8, as illustrated in FIG. 4B, the cover member 14 is laminated. More specifically, the cover member 14 is fixed onto the support member 8 in a state closing a cavity surrounded by the support member 8. A hollow portion B is thus formed. The cover member 14 is preferably made of a resin that is highly resistant to flux.

Figure 4C:
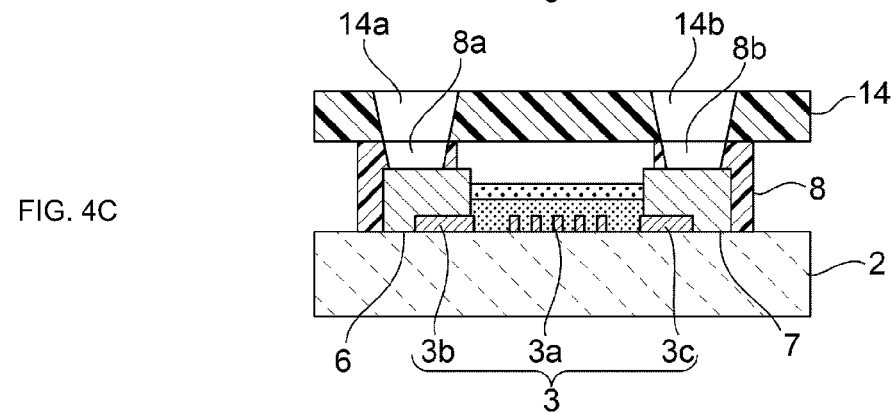

Next, as illustrated in FIG. 4C, the through-holes 8a and 8b and second through-holes, i.e., the through-holes 14a and 14b, are formed by irradiating the cover member 14 with a laser beam. With the irradiation of the laser beam, the temperature in a portion irradiated with the laser beam rises to a level as high as 900° C. to 1000° C. However, properties of the upper surfaces of the wiring electrodes 6 and 7 are hard to alter because, as described above, the upper surfaces of the wiring electrodes 6 and 7 are each made of the refractory metal layer.

Figure 4D:
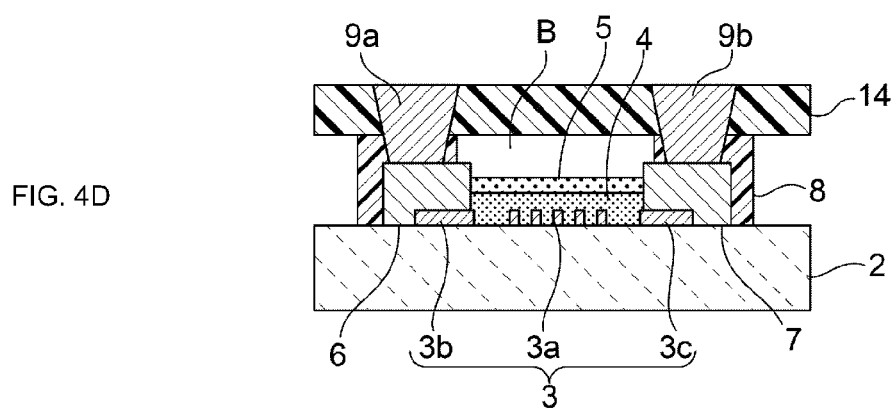

Next, as illustrated in FIG. 4D, the under bump metal layers 9a and 9b are formed to fill the through-holes 8a, 8b, 14a and 14b. More specifically, the under bump metal layers 9a and 9b are formed by successively forming a Ni plating film and an Au plating film in the mentioned order by an electrolytic plating method. Since the refractory metal films 11 are positioned as the upper surfaces of the wiring electrodes 6 and 7, the Ni plating film is sufficiently closely contacted with each of the wiring electrodes 6 and 7. Hence, the Ni plating film is able to be formed reliably. As a result, reliability of electrical connection is increased.

Next, the metal bumps 10a and 10b, illustrated in FIG. 1A, are disposed on the under bump metal layers 9a and 9b, respectively. More specifically, after arranging a metal mask, a solder paste made of Sn—Ag—Cu, for example, is applied onto each of the under bump metal layers 9a and 9b. The applied solder paste is then heated to a temperature at which it dissolves, thus making the solder paste adhered to each of the under bump metal layers 9a and 9b. Thereafter, flux is removed by using a flux cleaner. The metal bumps 10a and 10b having spherical shapes are formed in such a way.

In practice, the steps of FIGS. 2A to 4D are performed on a collective substrate. Accordingly, individual pieces of the elastic wave devices 1 are obtained by cutting the collective substrate after the step of FIG. 4D with a dicing machine.

Figure 5:
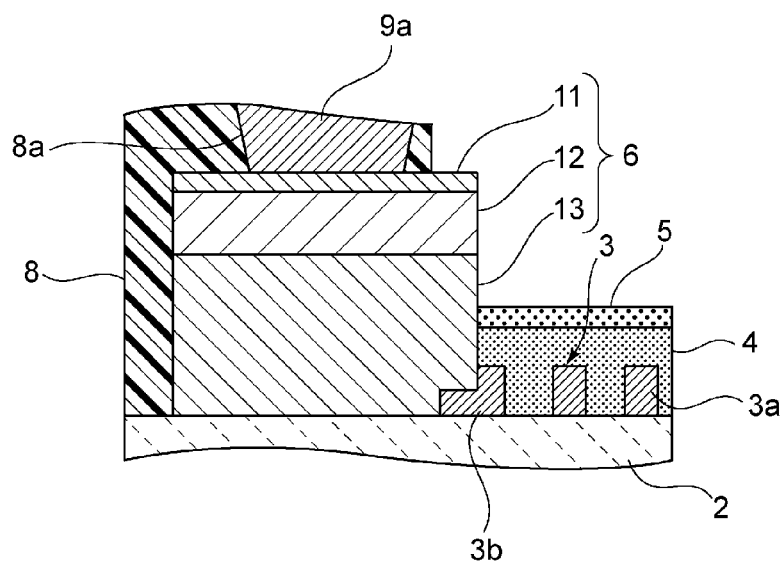
FIG. 5 is a partly-cut front sectional view referenced to explain principal portion of the elastic wave device according to a modification of the first preferred embodiment of the present invention.

FIG. 5 is a partly-cut front sectional view illustrating, in an enlarged scale, a portion of the elastic wave device 1 according to a modification where the wiring electrode 6 is disposed. In this modification, the under bump metal layer 9a is closely contacted with the upper surface of the refractory metal film 11 of the wiring electrode 6. Furthermore, in this modification, the terminal electrode 3b is not positioned under a portion where the under bump metal layer 9a, i.e., the metal bump 10a illustrated in FIG. 1A, is disposed. In other words, the IDT electrodes 3 are not positioned under the metal bump. Accordingly, a level difference is less apt to occur in a portion where the metal bump 10a is joined to the under bump metal layer above the wiring electrode 6. Hence, the upper surface of the wiring electrode 6 in that portion is made flat more easily.

Figure 6:
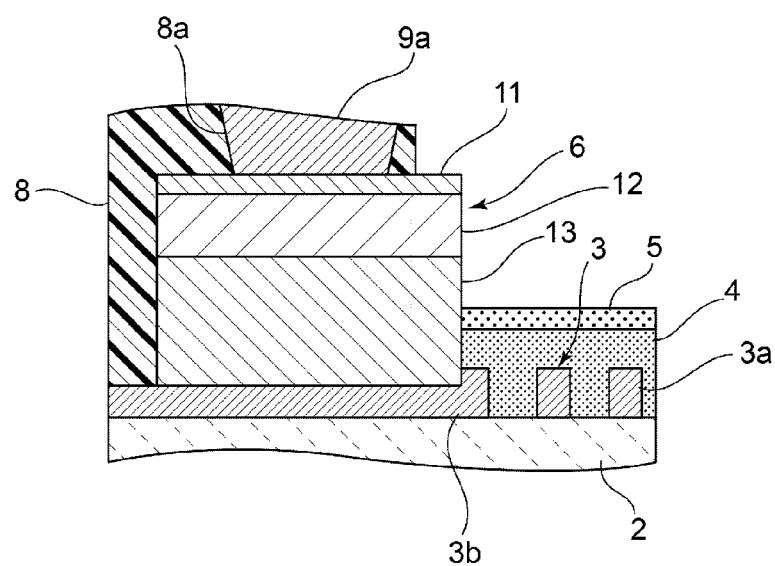
FIG. 6 is a partly-cut front sectional view referenced to explain principal portion of an elastic wave device according to another preferred embodiment of the present invention.

Alternatively, as illustrated in FIG. 6, a portion of the IDT electrodes 3, i.e., a portion of the terminal electrode 3b, may be present under the portion where the under bump metal layer 9a in continuation with the metal bump 10a is disposed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate;
   IDT electrodes on the piezoelectric substrate;
   wiring electrodes electrically connected to the IDT electrodes and covering portions of the IDT electrodes;
   an insulating member on the piezoelectric substrate, covering at least portions of the wiring electrodes, and including through-holes at which upper surfaces of the wiring electrodes are exposed; and
   conductive layers filled in the through-holes of the insulating member; wherein
   each of the wiring electrodes has a multilayer structure in which a refractory metal layer having a melting point of 900° C. or higher, a diffusion preventive film, and an Al or Al-alloy film are laminated successively from an upper surface side.

2. The elastic wave device according to claim 1, wherein the refractory metal layer is made of Pt.

3. The elastic wave device according to claim 1, wherein the through-holes penetrate through the insulating member.

4. The elastic wave device according to claim 1, wherein the diffusion preventive film includes a metal layer that is made of a metal selected from a group consisting of Cu, Au, Ti, Ta, Ni, Cr, W, Ag, Pd, Co and Mn, an oxide or a nitride of one of Cu, Au, Ti, Ta, Ni, Cr, W, Ag, Pd, Co and Mn, or an alloy mainly containing one of Cu, Au, Ti, Ta, Ni, Cr, W, Ag, Pd, Co and Mn.

5. The elastic wave device according to claim 1, further comprising metal bumps disposed on the conductive layers.

6. The elastic wave device according to claim 5, further comprising a cover member fixed to an upper surface of the insulating member, wherein the conductive layers penetrate through the cover member from the insulating member.

7. The elastic wave device according to claim 1, further comprising a first dielectric film covering the IDTs on the piezoelectric substrate.

8. The elastic wave device according to claim 7, further comprising a second dielectric film on the first dielectric film.

9. The elastic wave device according to claim 8, wherein the second dielectric film defines at least one of a frequency adjusting film and a moisture-resistant protective film.

10. The elastic wave device according to claim 1, wherein the insulating member is frame shaped and has a thickness greater than that of the IDTs.

11. The elastic wave device according to claim 1, wherein each of the conductive layers includes an under bump metal layer filling the through-holes.

12. The elastic wave device according to claim 1, wherein each of the conductive layers includes at least one of Pt, Au, Cu, Ti, Ni, Cr, W, Ag, Pd, Co and Mn, or alloys including at least one of Pt, Au, Cu, Ti, Ni, Cr, W, Ag, Pd, Co and Mn.

13. The elastic wave device according to claim 6, wherein a planar shape and size of the cover member is equal to or smaller than that of the piezoelectric substrate.

* * * * *